United States Patent [19]
Houston

[11] Patent Number: 5,457,695
[45] Date of Patent: * Oct. 10, 1995

[54] METHOD AND SYSTEM FOR SCREENING LOGIC CIRCUITS

[75] Inventor: Theodore W. Houston, Richardson, Tex.

[73] Assignee: Texas Instruments Incorporated, Dallas, Tex.

[*] Notice: The portion of the term of this patent subsequent to Jun. 11, 2008, has been disclaimed.

[21] Appl. No.: 300,503

[22] Filed: Sep. 2, 1994

Related U.S. Application Data

[63] Continuation of Ser. No. 842,672, Feb. 27, 1992, abandoned.

[51] Int. Cl.$^6$ .................................................. G11C 29/00
[52] U.S. Cl. ........................... 371/21.2; 371/21.4; 371/28
[58] Field of Search .................................. 371/21.4, 21.3, 371/21.1, 21.2, 28

[56] References Cited

U.S. PATENT DOCUMENTS

| | | | |
|---|---|---|---|
| 3,618,030 | 11/1971 | Creasy | 340/172.5 |
| 3,969,618 | 7/1976 | Strubel et al. | 235/153 |
| 4,061,908 | 12/1977 | de Jonge et al. | 235/302.3 |
| 4,418,403 | 11/1983 | O'Toole et al. | 365/201 |
| 4,503,538 | 3/1985 | Fritz | 371/28 |
| 4,553,225 | 11/1985 | Ohe | 365/201 |
| 4,646,307 | 2/1987 | Nishimura | 371/53 |
| 4,680,762 | 7/1987 | Hardee et al. | 371/28 |
| 4,819,237 | 4/1989 | Hamilton et al. | 371/66 |
| 4,903,265 | 2/1990 | Shannon et al. | 371/21.4 |
| 5,023,874 | 6/1991 | Houston | 371/21.2 |
| 5,053,698 | 10/1991 | Ueda | 324/158 R |
| 5,119,337 | 6/1992 | Shimizu et al. | 365/201 |

Primary Examiner—Robert W. Beausoliel, Jr.
Assistant Examiner—Joseph E. Palys
Attorney, Agent, or Firm—Ira S. Matsil; James C. Kesterson; Richard L. Donaldson

[57] ABSTRACT

A method of testing a circuit having one or more memory cells, such as a random access memory, register or latch, is disclosed herein. A selected pattern (e.g., all "1"s, all "0"s, or alternating "1"s and "0"s) is stored (block 10) in each memory cell of the circuit under test. The power to each of the cells is then lowered (block 12) to a selected voltage level which is below the static holding voltage. After a selected time period, the power to each of the cells is restored (block 14) and the logical state present in each cell is compared (block 16) with the initially stored logical state to determine if any of the cells have switched to another logical state. This procedure may be repeated (blocks 18–26) a number of times.

13 Claims, 3 Drawing Sheets

METHOD AND SYSTEM FOR SCREENING LOGIC CIRCUITS

This invention was made with government support under Contract No. DNA001-C86-0090 awarded by the Defense Nuclear Agency. The Government may have certain rights in this invention.

This a continuation of application Ser. No. 07/842,672 which was filed on Feb. 27, 1992, which was abandoned as part of a file wrapper continuation of application Ser. No. 08/300,574, which was issued as U.S. Pat. No. 5,422,852 on Jun. 6, 1995.

FIELD OF THE INVENTION

This invention generally relates to integrated circuits, and more particularly to a method and apparatus for screening memory circuits for preferred states to detect circuits having weak cells.

BACKGROUND OF THE INVENTION

To ensure the operability of a memory cell, including storage devices such as registers or latches, each individual device is usually tested after fabrication. The devices are tested by storing a known pattern into the stored cells of the device and subsequently reading the contents of the device. If the data input to the device is not identical to the data output from the device, then the device is discarded as having one or more failed cells. To detect hard failures, where a memory cell is always one or always zero, the device is tested with different patterns, such that each cell is tested for its ability to successfully store both logic states.

Where higher reliability is needed, more extensive testing may be performed on the devices. For example, the devices may be tested at different temperature ranges to ensure the operability of the device over a specified temperature range. Similarly, the device may be tested over a specified voltage range to determine failures. In some instances, the devices will be tested after a prescribed "burn-in" period, typically, 24 to 48 hours, wherein the device is operated during the burn-in period. If the device is likely to fail during operation, it has been found that there is a high probability that the chip will fail during the burn-in period.

Nevertheless, the operational testing does not detect all errors which may occur due to processing variations and inaccuracies. A memory device may fail because some of its cells are "weak," i.e., they may be prone to upset, wherein the stored cell may flip from the stored logic state to the complementary logic state. Upset may occur in a weak cell due to several external factors. Alpha particles emitted from the packaging materials may cause a weak memory cell to switch states. Similarly, a high energy ion may impinge the memory cell, leaving electron/hole pairs which cause the cell to upset. This phenomena is known as single event upset, or SEU. Further, a burst of gamma radiation may generate electron hole pairs which push the voltage toward the mid-rail, causing the memory cell to switch states. A memory device's immunity to gamma radiation is known as its transient dose hardness. It is also possible that as parameters change with time, for example with hot electron degradation or with metal migration, a weak cell may become a failure.

Therefore, a need has arisen in the industry for a test which will detect weak memory cells in a storage device.

SUMMARY OF THE INVENTION

Other objects and advantages will be obvious, and will in part appear hereinafter and will be accomplished by the present invention which provides a method and system for screening logic circuits.

A method of testing a circuit having one or more memory cells, such as a random access memory, register or latch, is disclosed herein. A selected pattern (e.g., all "1"s , all "0"s , or alternating "1"s and "0"s ) is stored in each memory cell of the circuit under test. The power to each of the cells is then lowered to a selected voltage level which is below the minimum data holding level. The selected voltage level may have been previously determined. After a selected time period (which may also have been previously determined), the power to each of the cells is restored and the logical state present in each cell is compared with the initially stored logical state to determine if any of the cells have switched to another logical state. This procedure may be repeated a number of times.

The testing method may be used to test the reliability of a memory device or to categorize storage devices in different reliability classifications. The classifications may be for varied threshold voltage levels, nominal time periods or temperatures.

In a specific embodiment, a selected pattern (e.g., all "1"s ) is stored in each memory cell of the circuit under test. The power to each of the cells is then lowered below a selected threshold voltage level. After a selected time period, the power to each of the cells is restored. The logical state present in each cell is then compared with the selected pattern to determine if any of the cells have switched to another state. The procedure is then repeated by storing the complement of the initially selected pattern (e.g., all "0"s ) in each memory cell of the circuit. The power to each of the cells is lowered below the selected threshold voltage level (which may or may not be the same as before) and after a time period the power is restored. The logical state present in each cell is once again compared with the stored complement logical state to determine if any of the cells have switched to another state.

This aspect of the present invention has the technical advantage that cells having a preferred state can be detected. The more balanced the cell, the longer the stored state will be retained at the reduced power level and/or the lower the threshold voltage may go. The more imbalanced the cell, the sooner it will switch from the stored state to the preferred state once power is interrupted. Cells having a preferred state can be detected and classified as more prone to upset and as having a lower transient dose hardness.

Another aspect of the present invention will determine whether any cells of the storage device have a preference toward either logical state.

In yet another aspect of the invention, the ability to classify storage devices into various reliability categories for different applications is provided.

BRIEF DESCRIPTION OF THE DRAWINGS

The above features of the present invention will be more deafly understood from consideration of the following descriptions in connection with accompanying drawing in which.

DETAILED DESCRIPTION OF PREFERRED EMBODIMENTS

Figure 1:
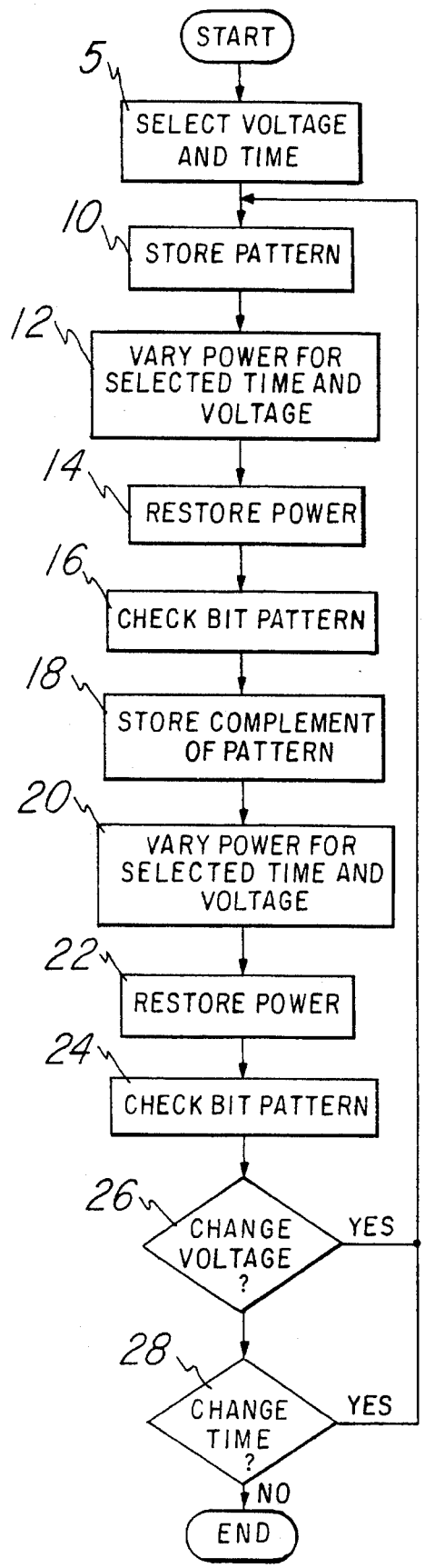
FIG. 1 illustrates a flow chart describing the preferred embodiment screening test of the present invention.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The present invention is related to U.S. Pat. No. 5,023,874 by Houston which was issued on Jun. 11, 1991 and is assigned to the assignee of this patent.

During the fabrication of an integrated circuit, processing variations are certain to occur between different wafers, and between different circuits on a single wafer. For example, line widths, implant densities, and oxide thicknesses may vary from the optimum within a certain degree from circuit to circuit. To some extent, these variations are always present.

Processing variations may cause some cells to have a preference to a logical state, either a "1" or "0". As the voltage stored in the cells approaches a mid-rail between a logical "0" and a logical "1", the storage cell will tend to latch onto the voltage in accordance with its preference. In other words, a cell having a preference towards a logical "1" will respond to a voltage near the mid-rail as being set to a "1", while a cell having a preference towards logical "0" will tend to respond to a voltage near the mid-rail as being set to a "0". The preference may be either slight or strong depending on the degree of process variations. In the extreme case, a cell may respond to all input voltages as either logical "1"s or logical "0"s.

Under normal circumstances, a storage cell with a preference will operate normally if the preference is not too strong. However, less perturbation, such as from alpha particles or high energy ions, is required to upset the cell from its unpreferred state to its preferred state than would be required to upset a balanced cell.

Thus, by determining which devices have cells with preferred states, storage devices can be screened to determine those less likely to encounter upset.

A method for locating soft cells in a RAM is disclosed by Hardee et al. in U.S. Pat. No. 4,650,762 ('762). With this technique, a known logic pattern is written in the memory array and the wordlines for the array are sequentially subjected to a non standard test signal such as a slowly varying voltage. To implement the preferred embodiment, an access pad is added for receipt of an externally generated test signal. A central circuit is also used to selectively couple the test signal to the wordlines of the memory array.

The method disclosed in the '762 patent has several shortcomings. Since it is necessary to include a separate test pad and circuitry, valuable chip space is used and performance may be degraded. In addition, a special analog voltage signal (e.g., a sawtooth voltage waveform) applied to the wordlines. This signal must be generated especially for this purpose.

The present invention, on the other hand, depends on varying the power supply voltage (as opposed to the wordline voltage). As will be described below, the power can be lowered or turned all the way off. This method provides an advantage because no additional test pads are required since the supply voltage is being effected. Other advantages will also be apparent within the description below.

The preferred embodiment of the present invention is best understood by referring to FIG. 1.

FIG. 1 illustrates a flow chart for a screening test to determine which devices have cells with preferred states. For purposes of illustration, FIG. 1 will be described in connection with a static random access memory (SRAM); however, it should be noted that the test illustrated in FIG. 1 should be able to determine weak cells in other devices such as registers, latches, microprocessors having internal storage memories, pseudo-static DRAMs, FIFOs, and other devices.

In block 5, a selected voltage level and a selected time period are determined. The voltage level is below the static holding voltage (i.e., below the minimum dataholding limit voltage). Details on the selection of the voltage and time will be discussed hereinbelow.

In block 10, a pattern of logical values is stored into the SRAM. For example, a logical "1" (or logical "0") could be written into all the memory locations in the In block 12, the power to the SRAM is lowered for a nominal time period. Here, the power is lowered below the selected voltage level which is below the static holding voltage. In other words, the power is lowered below a threshold at which the memory cell would normally lose stored data if left there for a long enough period of time (which is longer than the nominal time period referred to in block 12).

In block 14, the normal power is restored (i.e., returned to an operating level at which data can be stored and maintained indefinitely) to the SRAM. Under normal circumstances, a fully discharged SRAM will have random logical values in its cells at power-up. However, once data is written into the cells, the power may be lowered below the static holding voltage (or even turned off) for a short time period without the data being lost. If, however, the SRAM has one or more cells with preferred logical states, those cells will likely switch to their preferred state when power is restored. Also, if the SRAM has cells with excessive leakage, reduced capacitance, or weak drive currents, these cells will more likely go to a random state, even if balanced. The longer the time period at low power (or power-off), the more likely that the cell with the preferred state will actually switch to that state or that the balanced but otherwise weak cell will switch to a random state.

In block 16, the data is read from the SRAM and compared to the stored pattern in block 10. For example, if all "1"s were stored in block 10, the data read from the SRAM in block 16 should be all "1"s as well. If any "0"s are present, then it can be determined that the cell has a preference towards a logical "0".

In block 18, a complementary pattern is stored in the SRAM. Thus, if all "1"s were stored in block 10, then all "0"s would be stored in the SRAM in block 18. Once again, in block 20, the power is lowered for a nominal time period. In block 22, power is restored and, in block 24, the bit pattern is read from the SRAM and, compared to the complementary pattern stored in block 18. If one or more of the cells of the SRAM have stored "1"s, then the cells may be classified as having a preference towards a logical "1".

As illustrated by blocks 26 and 28, the test may be repeated with a different voltage levels and/or time periods.

The test may also be repeated a number of times with the same time and voltage for greater accuracy. By repeating the test, cells which may be weak in either direction may be detected.

The test of the present invention is accomplished with the use of control circuits to adjust the value of the lowered power supply value, and a pulse generator or timing circuit to control the time that the SRAM is powered to the lower voltage. The value of the lowered voltage and the time at which it remains at the lowered value is dependent on the technology and the memory cell design, but could be the same for a given part type once the values have been established through experiment.

The circuitry that controls the lowering of the supply voltage must also control all signal voltages to that same level so that power is not supplied through the signal inputs and input protection circuitry. An enable circuit provides the modified supply and signal voltage high ($V_{cc}'$) and low ($V_{ss}'$) to the device under test. The $V_{cc}'$ is set to the nominal supply voltage level, while the $V_{ss}'$ is set to the lowered voltage level. One specific example of a circuit implementation will be described below with respect to FIG. 2.

To establish timing and voltage levels for screening of an SRAM or other part, an initial time and voltage level are selected, such as 0.1 seconds and 0.5 volts. Then either the voltage or time is held constant while the other is varied to obtain a response of bit upsets as a function of the two variables. From this response, the weak bit screening test parameters can be established.

The nominal time period for power interruption may be determined empirically by using a benchmark test cell. The test may be performed on the benchmark test cell several times using increasingly longer time periods. At some point, the benchmark test cell will no longer be able to retain this information and errors will be seen in blocks 16 and 24 of FIG. 1. Using the longest time at which the benchmark test cell does not show errors as the nominal time period, devices may be classified in relation to the benchmark. It should be noted that the nominal time period may differ for different devices. For example, a 16K SRAM may have a different nominal time period than a 256K SRAM, even though the probability of upset in both cells is substantially the same. Also, the interrupt time may be set for a duration shorter than that found for the benchmark cell.

Likewise, the threshold voltage below which the power is lowered (i.e., a voltage below the minimum data holding voltage limit) may be determined empirically. This test may also be made using a benchmark cell. The test may be performed on the benchmark test cell several times using increasingly low voltages with a given time period. In other words, the voltage level and time period may be determined in pairs. For example, if the power is turned completely off (e.g., the threshold voltage is zero volts), a selected nominal time will be determined. This was the case discussed in the aforementioned U.S. Pat. No. 5,023,874 ('874). In other cases, the power is turned to a voltage greater than zero and a different nominal time is determined.

The present invention has several advantages over the '874 patent. The method of turning the power fully off works well with memory cells which have a long dynamic hold time. However, if a memory cell has a relatively short dynamic hold time, turning the power fully off may not be suitable. These cells are better suited for simply lowering the voltage as described herein. This invention is important for cells not specifically designed for high resistance to upset, and becomes especially important as memory cells become smaller and therefore have shorter dynamic hold times.

In SRAMs, information in the array will be maintained indefinitely as long as the supply voltage is maintained above some minimum data-holding limit voltage. The information, however, may be lost if the supply voltage is lowered below the minimum data-holding voltage. Because of capacitance effects, the information will be retained if the supply voltage is briefly lowered below the minimum data-holding voltage and then restored. The length of time that the voltage can be lowered below the minimum data-holding voltage without loss of information is dependant on how much the voltage is lowered. The lower the voltage, the shorter the time before the voltage must be restored for retention of the information. The duration of memory retention with the supply voltage below the minimum data-holding voltage is reduced by any imbalance in the cell, particularly any imbalance in leakage currents or node capacitances, as might be caused by defects.

One method of determining a threshold voltage is disclosed by Ohe in U.S. Pat. No. 4,553,225 ('225). In this patent, predetermined data is written into an IC memory at a normal-operation power-supply voltage, and the written data is read out and confirmed. Next, the power-supply voltage is lowered and is then returned to the normal-operation power-supply voltage after a predetermined period of time has passed in order to determine whether the stored data is in agreement with the data as initially written. When the stored data is in agreement with the data as initially written, the power-supply voltage is further lowered to repeat the above-mentioned procedure. The above-mentioned procedure is further repeated when the stored data is in agreement with the initially written data and a minimum data-holding limit voltage which is capable of holding the written data is thereby determined.

In other words, the '225 patent teaches a method testing IC memories which is capable of determining the minimum data-holding limit voltage of the memory cells, and further teaches the use of this method to find memory elements that have an unstable cell margin.

The present invention, however, teaches the determination of the duration of data hold time for supply voltages below the minimum data-holding limit voltage. The application of this method to the determination of memory elements that have imbalances is also described. One advantage of the present invention is that the dynamic test is particularly sensitive to leakage currents and imbalances in leakage current or node capacitances. Also, the flexibility of being able adjust the combination of the dynamic holding voltage level and the duration of the lowered voltage allows optimization of the technique for a given combination of integrated circuit memory technology and test equipment. For memory elements with relatively large capacitances, the drop in voltage can be increased for faster test time. For memory elements with relatively small capacitances, the voltage drop can be reduced to provide a dynamic hold time in a range that is readily measured, according to the test equipment being used.

To summarize, in the present invention, a threshold voltage is determined. This threshold voltage may be determined using some empirical method or even a sequence of tests similar to those described in the '225 patent. (A method similar to that of the '225 patent can only be used if a nominal time period is first determined as discussed herein.) In addition, if the threshold voltage is known by other means, such as past experience for instance, this will count as the step of determining.

In an alternative embodiment of the present invention, each cell is tested over a range of interrupt times and/or threshold voltages until failure occurs, and the parts are categorized accordingly. In this embodiment, one specific benchmark time period is not required.

Although FIG. 1 has been described using patterns of all "1"s and all "0"s, other patterns can be used if desired, such as alternating "0"s and "1"s. In some circumstances, the preference of one cell may be influenced by the value stored in adjacent cells; therefore, it may be desirable to use a plurality of different patterns in testing the devices. It is generally desirable that during the test each cell have at least one logical "1" and one logical "0" written to it, such that the preference for either value may be determined.

Also, it should be noted that while FIG. 1 has been discussed in relation to an SRAM, many different devices may also be tested using the present invention. Any device which has a plurality of states and which will dynamically retain state information for some period of reduced power may be screened using the test of the present invention. Such devices would include registers, latches and similar devices used within larger integrated circuits such as microprocessors. It may also be possible to use the present invention with pseudo-static DRAMs.

Additionally, the test of the present invention may be used in conjunction with other qualifying factors. For example, the test could be performed over different temperature and input voltage ranges, or other environmental ranges, to determine different classifications of reliability. Further, the devices could be tested over a range of nominal time periods, to determine the degree to which the devices are resistant to upset. Thus, the devices could be easily matched to the specific applications in which they are used.

It should also be noted that this test can be used to qualify a wafer or lot for retention time as a combined test for capacitance, uniformity and leakage. Thus, the retention time for a "balanced" cell may be determined by following the procedure described above for determining the nominal time period for power interruption with a given voltage level.

Figure 2:
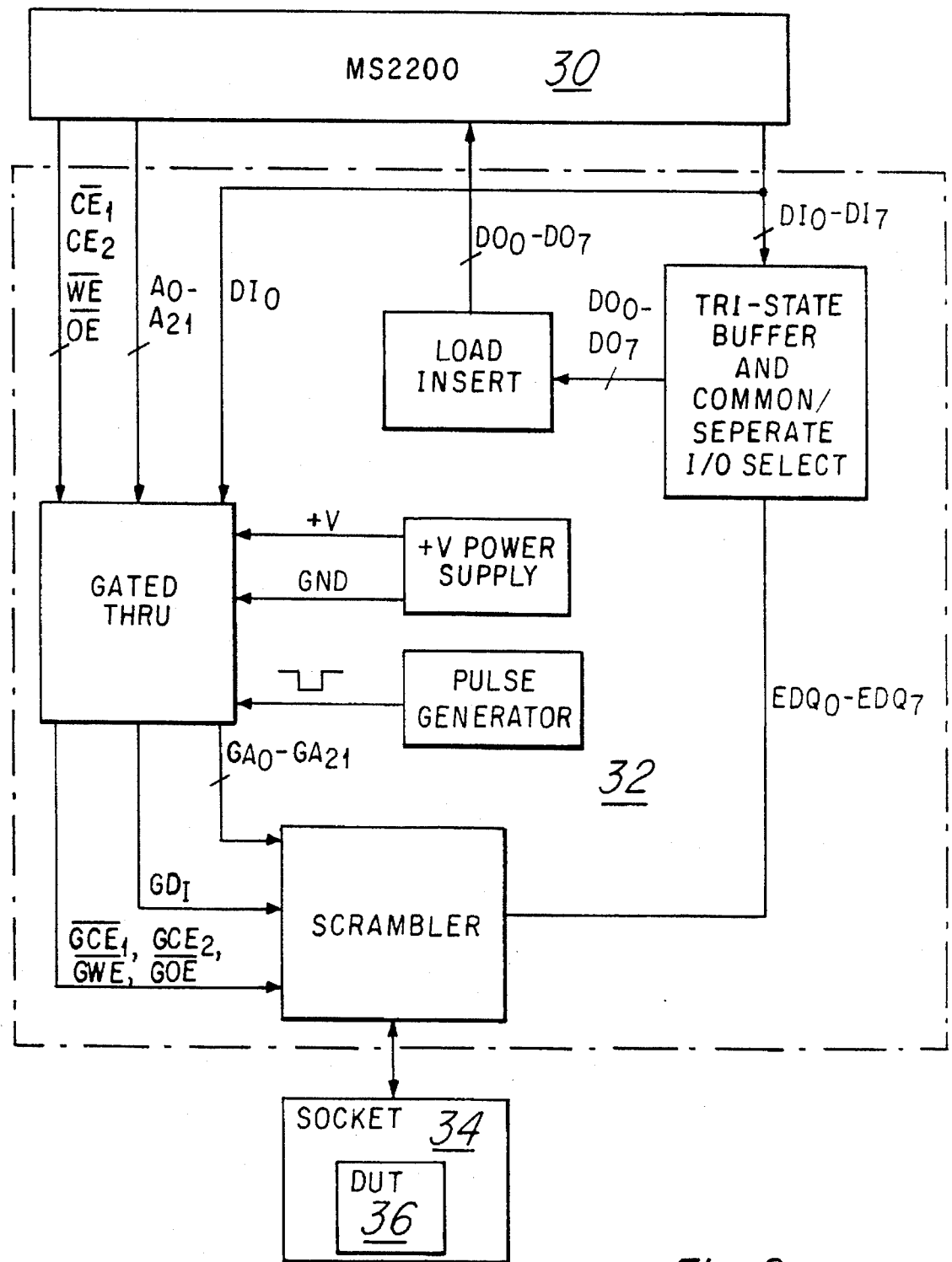
FIG. 2 illustrates a block diagram of an exemplary circuit for performing the test of the present invention.

An exemplary circuit implementation for performing the test of the present invention will now be described. Referring to FIG. 2, the test circuit includes a power-off board 32 to be used on the MosAid MS2200 tester 30. Although described herein with reference to the MS2200 tester, as will be obvious to those skilled in the art, other testing systems may also be used.

The circuitry described herein will allow the ability to perform the following tests: 1) Search for weak bits—bits which do not retain their data as readily as other bits. 2) Memory retention—determination of the length of time which a memory will retain a pattern which has been written when the power has been disabled. 3) Power-ON/OFF glitch—examination of the power consumed upon enabling or disabling power to the device.

The tester will be designed to be generic in the sense that one MS2200 board will be used for all tests. This board will have signals brought to a 40 pin ZIP socket 34 which will then be scrambled for the particular device under test (DUT) 36.

The 40 pin ZIP socket 34 has pins with the following functions:

| Pins | Descriptions |
|---|---|
| 1–22 | Addresses $A_0$–$A_{21}$, all of the available addresses. |
| 1–8 | Selectable between $DQ_0$–$DQ_7$ for COMMON I/O or as $DO_0$–$DO_7$ for SEPARATE I/O devices. |
| 1 | DI for SEPARATE I/O devices. |
| 2 | $CE_1$ and $CE_2$ to allow for a maximum of two chip selects. |
| 1 | OE for output enable signal. |
| 1 | WE for write enable signal. |
| 1 | $V_{ss}$. |
| 1 | $V_{bb}$. |
| 1 | $V_{cc}$. |
| 38 | Total number of used pins. |

Some of the signals will be gated with a control pulse while some will be allowed to pass through a 3-state buffer. The following is a list of the signals and how they will be controlled.

| Signals | How generated |
|---|---|
| $GA_0$–$GA_{21}$ | Addresses $A_0$–$A_{21}$ gated through 74HC808 by external pulse. |
| $EDQ_0$–$EDQ_7$ | COMMON I/O data lines with $D_0$–$D_7$ enabled by WE pulse. |
| GDI | SEPARATE I/O Data in gated through 74HC808 by ext. pulse. |
| $\overline{GCE_1}$ | CE gated through 74HC808 by external pulse. |
| $GCE_2$ | C4 gated through 74HC808 by external pulse. |
| $\overline{GOE}$ | OE gated through 74HC808 by external pulse. |
| GWE | WE gated through 74HC808 by external pulse. |
| $GV_{cc}$ | VCC produced from 74HC808 enabled by external pulse (use two of the AND's in 74HC808 for higher current.) |

It is noted that the 74HC808 is a HEX CMOS AND buffer and that five of these packages should typically suffice. There will be 29 signals gated through the 74HC808 and 8 signals enabled through 3-state buffers.

The input from the enabling external pulse should typically be buffered to provide enough drive for all 29 gates. This can be accomplished by using a 74HC04 and buffered through one of the hex buffers in this package.

The 3-state signals can be easily generated using a 74HC244.

Typically, all signals will be driven to ground except the COMMON I/O DQ's which will have their inputs in 3-state (generally) and their outputs will pass back to the MosAid 2200.

The outputs will pass through the output load selection adapter which will use plug-ins to determine whether or not there is a load and of what kind it will be. This will also allow for easy disconnect of the outputs for active read power measurements.

In the preferred embodiment, the board will have the following components placed on it.
 1. One 40 pin ZIP socket.
 2. Five SN74HC808 I.C.'s which will be used to gate the signals.
 3. One SN74HC244 I.C. which will be used to 3-state the data in lines.
 4. One SN74HC04 I.C. to buffer the external gate pulse.
 5. One 16 pin DIP type socket for Connect/Disconnect of the COMMON/SEPARATE I/O lines.
 6. One 16 pin DIP type socket for connecting the output data to the proper load.

7. One female BNC connector for the external pulse from generator.
8. One 50 ohm resistor for external pulse on BNC.
9. Two banana plugs for connecting external power supply for the gates and buffers.

In one aspect, the key to the method of implementation discussed herein is in the way in which the variable supply and signal levels to the DUT are obtained and controlled. In this example, the key is the use of the buffer circuit with variable supply voltages. The $V_{cc}'$ supply to the buffer is varied to control the DUT "on" $V_{cc}$ level and the DUT $V_{ih}$ signal levels. The $V_{ss}'$ supply is varied to control the DUT power down $V_{cc}$ level and the DUT $V_{il}$ signal levels. This circuit ensures that both the $V_{cc}$ and the signal levels to the DUT are lowered to the same preselected voltage for the screening test.

Figure 3:
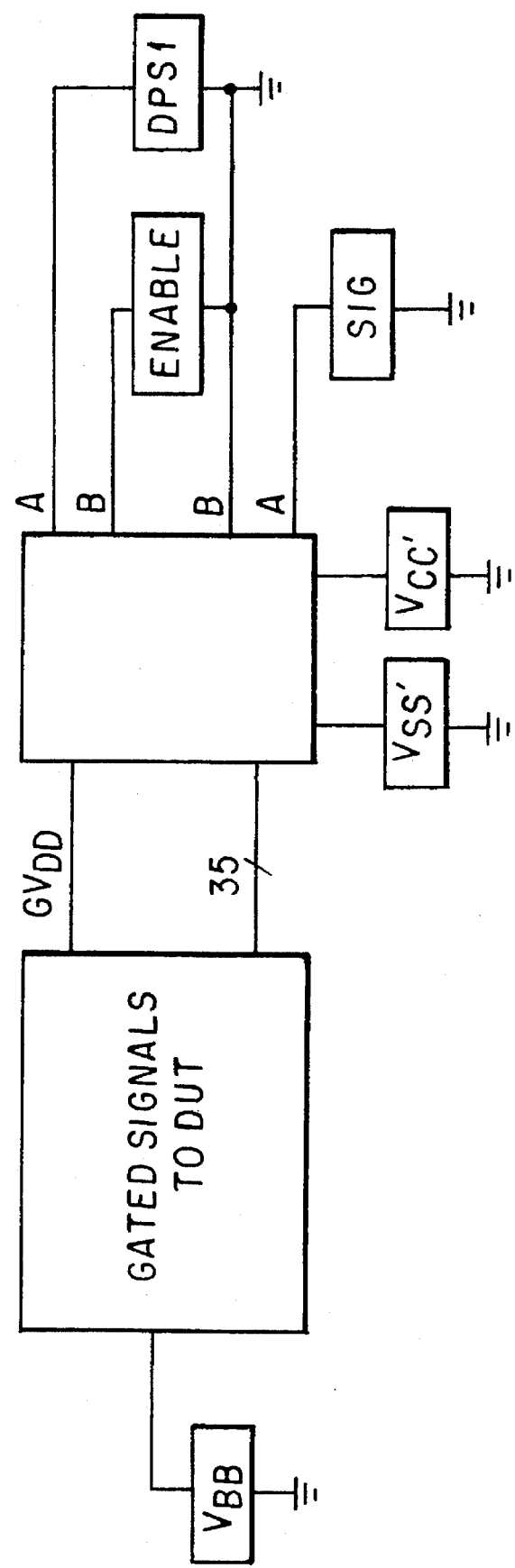
FIG. 3 illustrates a block diagram of a modified exemplary test system.

FIG. 3 illustrated a modification to the power-offboard which allows the user to specify both $V_{IH}$ and $V_{IL}$ relative to ground. Referring to FIG. 3, the "enable" signal is the timing control for the power down time, the DPS1 is the source $V_{cc}$ supply in the memory tester, and the "sig" are the logic control signals from the memory tester. Signals A (DPS1) and B (enable) are ANDed together as well as signals A (sig) and B (enable) to control the timing of the screen test. Then the supplies $V_{ss}'$ and $V_{cc}'$ control the voltage levels to the DUT as described above.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of testing a circuit having one or more memory cells, comprising the steps of:
   determining a static holding voltage for said circuit under test;
   selecting a selected voltage level which is below said static holding voltage;
   storing a logical state according to a selected pattern in each of a plurality of memory cells of said circuit under test;
   lowering the power to each of the plurality of cells to said selected voltage level;
   restoring the power to each of the cells after a selected nominal time period; and
   comparing the logical state present in each cell with said stored logical state after power has been restored to said cells to determine if any of the cells have switched to another logical state.

2. The method of claim 1 wherein said first selected voltage level is zero volts.

3. The method of claim 2 wherein said step of lowering the power comprises the step of turning the power off.

4. The method of claim 1 and further comprising the steps of repeating said storing, lowering, restoring and comparing steps a predetermined number of times.

5. The method of claim 1 and further comprising the steps of:
   storing selected logical states according to a different selected pattern in each memory cell of said circuitry under test;
   lowering the power to each of the cells to a second selected voltage level;
   restoring the power to each of the cells after a selected time period; and
   comparing the logical state present in each cell with said different selected pattern after power has been turned restored said cells to determine if any of the cells have switched to another logical state.

6. The method of claim 5 wherein the step of storing selected logical states according to a different selected pattern comprises storing the complement of the logical state previously stored in each memory cell under test.

7. The method of claim 1 wherein said selected pattern comprises all logical "1"s.

8. The method of claim 1 wherein said selected pattern comprises all logical "0"s.

9. The method of claim 1 wherein said selected pattern comprises a patten of alternating logical "0"s and logical "1"s.

10. The method of claim 1 wherein said determining a static holding voltage comprises the step of empirically determining said static holding voltage.

11. The method of claim 10 wherein said determining a static holding voltage comprises the steps of:
    writing predetermined data into said circuit under test at a normal-operation power-supply voltage;
    reading out and confirming said predetermined data;
    lowering the power to said circuit to a first level;
    returning to the normal-operation power-supply voltage after a predetermined period of time has passed in order to determine whether the presently stored data is in agreement with said predetermined data;
    if said presently stored data agrees with said predetermined data, lowering the power to said circuit to a level below said first level;
    repeating said returning and lowering steps until the presently stored data is not in agreement with said predetermined data.

12. The method of claim 1 wherein said static holding voltage is determined from past experience.

13. A method of testing a storage device with one or more storage cells comprising the steps of:
    determining a static holding voltage for said circuit under test;
    selecting a threshold voltage which is lower than the static holding voltage;
    storing a logical state according to a selected pattern in each memory cell of said circuit under test;
    lowering the power to each of the cells below said selected threshold voltage level;
    restoring the power to each of the cells after a nominal time period;
    comparing the logical state present in each cell with said selected pattern after power has been restored to determine if any of the cells have switched to another state;
    storing the complement of the logical state in each memory cell from that previously stored;
    lowering the power to each of the cells below said selected threshold voltage level;
    restoring the power to each of the cells after said nominal time period; and
    comparing the logical state present in each cell with said stored complement logical state after power has been restored to determine if any of the cells have switched to another state.

* * * * *